(12) United States Patent
Tanbakuchi et al.

(10) Patent No.: US 7,161,358 B1
(45) Date of Patent: Jan. 9, 2007

(54) IMPEDANCE ANALYZER

(75) Inventors: Hassan Tanbakuchi, Santa Rosa, CA (US); Loren Cole Betts, Rohnert Part, CA (US); David Blackham, Santa Rosa, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 11/374,502

(22) Filed: Mar. 13, 2006

(51) Int. Cl.
*G01R 27/02* (2006.01)

(52) U.S. Cl. .................. 324/605; 324/622; 324/637; 324/642; 324/707

(58) Field of Classification Search ............... 324/605, 324/622, 637, 642, 707
See application file for complete search history.

(56) References Cited

U.S. PATENT DOCUMENTS

| | | | |
|---|---|---|---|
| 2,931,900 A * | 4/1960 | Goodman ............ | 324/76.11 |
| 5,307,284 A * | 4/1994 | Brunfeldt et al. ........ | 702/76 |
| 6,529,844 B1 | 3/2003 | Kapetanic et al. | |
| 6,836,743 B1 | 12/2004 | Blackham et al. | |
| 6,970,000 B1 * | 11/2005 | Evers et al. ............ | 324/638 |

\* cited by examiner

*Primary Examiner*—Andrew Hirshfeld
*Assistant Examiner*—Thomas Valone

(57) ABSTRACT

An impedance analyzer includes a reference signal, a first converter a first coupler, a second converter, a second coupler, a modification circuit, a reference signal detector, and a reflected signal detector. The first coupler couples the reference signal to the first converter. The first converter produces a reference intermediate frequency signal. The second coupler couples a reflected signal to the second converter. The second converter produces a reflected intermediate frequency signal. A reflection coefficient for a device under test is determined by using a reflected value detected by the reflected signal detector and a reference value detected by the reference signal detector. In a first operating mode of the impedance analyzer, the reflected intermediate frequency signal is forwarded directly to the reflected signal detector. In a second operating mode of the impedance analyzer, the modification circuit operates on the reference intermediate frequency signal to produce an adjustment signal that is combined with the reflected intermediate frequency signal before a resulting signal is forwarded to the reflected signal detector.

20 Claims, 2 Drawing Sheets

IMPEDANCE ANALYZER

BACKGROUND

A typical vector network analyzer (VNA) has the ability to measure device under test (DUT) impedance when the DUT impedance is close to the characteristic impedance of the VNA to a good precision and up to about a 100 gigahertz (GHz) stimulus frequency. For example, a typical characteristic impedance of a VNA is 50 ohms.

A VNA, for example, measures the reflection coefficient resulting from the DUT impedance in order to determine DUT impedance. The reflection coefficient directly varies with the DUT impedance.

When the DUT impedance is close to 50 ohms, the value of the reflection co-efficient for the DUT is very sensitive to changes in DUT impedance. This results in a low signal-to-noise ratio (SNR) when using the value of the reflection co-efficient to determine the DUT impedance. Thus it is possible to determine a value for DUT impedance to a high resolution.

When the DUT impedance is much less than 50 ohms (e.g. less than 5 ohms), the value of the reflection co-efficient for the DUT is not very sensitive to changes in DUT impedance. This results in a high signal-to-noise ratio (SNR) when using the value of the reflection co-efficient to determine the DUT impedance. In this case, it is possible to determine a value for DUT impedance only to a lower level of resolution.

Likewise, when the DUT impedance is much greater than 50 ohms (e.g. greater than 400 ohms), the value of the reflection co-efficient for the DUT is not very sensitive to changes in DUT impedance. This results in a high signal-to-noise ratio (SNR) when using the value of the reflection co-efficient to determine the DUT impedance. In this case, it is possible to determine a value for DUT impedance only to a lower level of resolution.

SUMMARY OF THE INVENTION

In accordance with embodiments of the present invention, an impedance analyzer includes a reference signal, a first converter, a first coupler, a second converter, a second coupler, a modification circuit, a reference signal detector, and a reflected signal detector. The first coupler couples the reference signal to the first converter. The first converter produces a reference intermediate frequency signal. The second coupler couples a reflected signal to the second converter. The second converter produces a reflected intermediate frequency signal. A reflection coefficient for a device under test is determined by using a reflected value detected by the reflected signal detector and a reference value detected by the reference signal detector. In a first operating mode of the impedance analyzer, the reflected intermediate frequency signal is forwarded directly to the reflected signal detector. In a second operating mode of the impedance analyzer, the modification circuit operates on the reference intermediate frequency signal to produce an adjustment signal that is combined with the reflected intermediate frequency signal before a resulting signal is forwarded to the reflected signal detector.

DESCRIPTION OF THE EMBODIMENT

Figure 1:
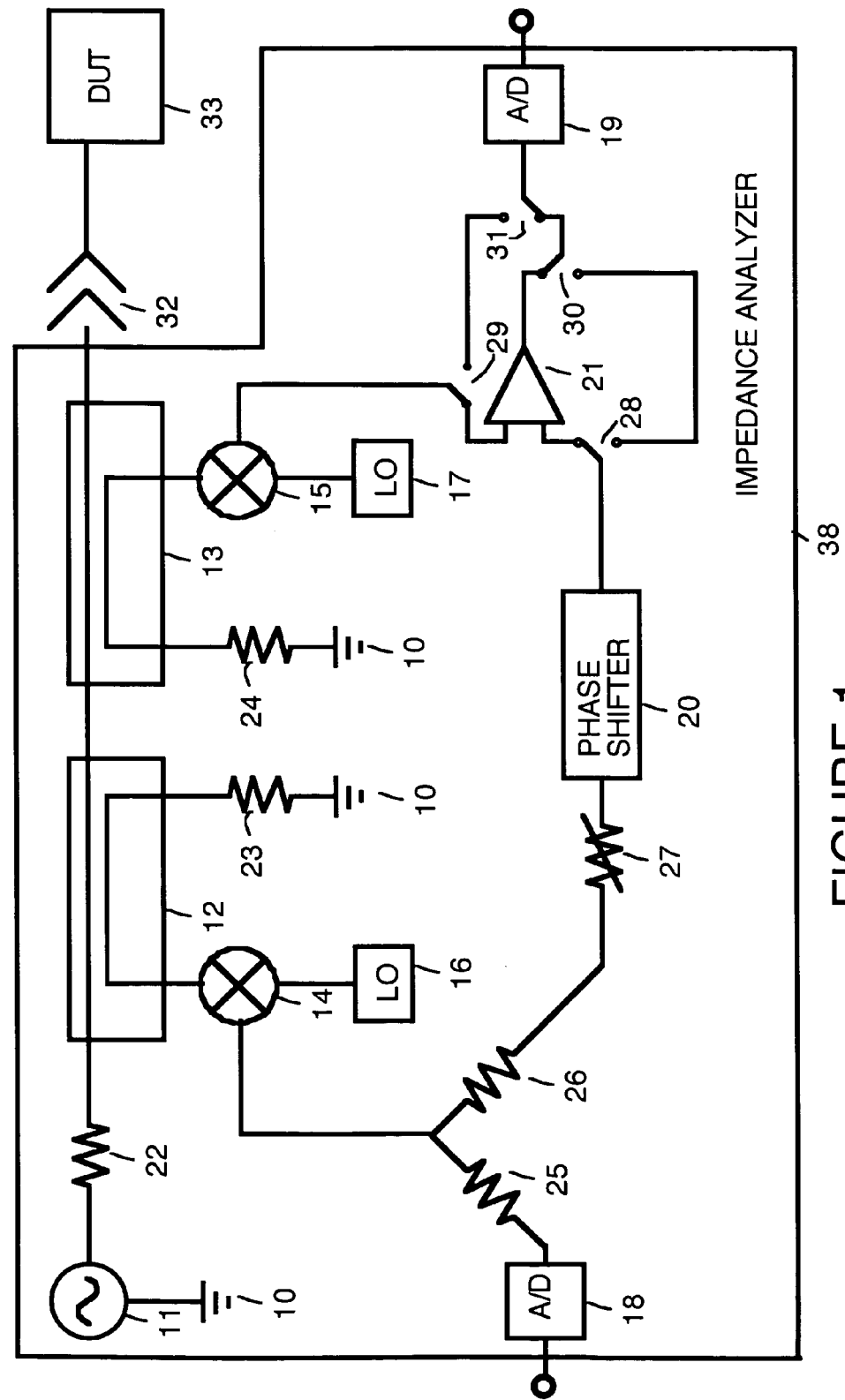
FIG. 1 is a simplified block diagram of an impedance analyzer in accordance with an embodiment of the present invention.

FIG. 1 is a simplified block diagram showing an impedance analyzer 38. A signal source 11 connected to a system ground 10 generates a reference signal through a resistance 22. A signal coupler 12 couples the reference signal to a signal line between a mixer 14 and a resistor 23 connected to system ground 10. Mixer 14 mixes the coupled reference signal with a local oscillator signal from a local oscillator (LO) 16 to convert the reference signal to an intermediate frequency signal that can be captured using an analog-to-digital (A/D) converter 18. A resistor 25 and a resistor 26 serve to provide the lower frequency signal to A/D converter 18 as well as to an attenuator 27. Attenuator 27 presents an attenuated signal to a phase shifter 20.

The reference signal is sent through transmission line 32 to a DUT 33. A reflected signal returns from DUT 33. A signal coupler 13 couples the reflected signal to a signal line between a mixer 15 and a resistor 24 connected to system ground 10. Mixer 15 mixes the coupled reference signal with a local oscillator signal from a local oscillator 17 to convert the reflected signal to an intermediate frequency signal that can be captured for analysis by an A/D converter 19.

Local oscillator 16 and local oscillator 17 are derived from the same source. Also the path length connecting local oscillator 16 to mixer 14 is equal to the path length connecting local oscillator 17 to mixer 15. This insures the reference signal and the reflected signal will have the same phase and correlated phase noise. This will allow common mode cancellation of coherent noise when an adjusted signal is subtracted from the reflected signal by a variable gain differential amplifier 21.

When a switch 29 and a switch 31 connect the lower frequency signal from mixer 15 directly to A/D converter 19, the system is in a VNA mode and acts as a conventional one port VNA or reflectometer. The reflection coefficient ($s_{11}$) for DUT 33 can be calculated by dividing the value detected by A/D converter 19 by the value detected by A/D converter 18. Once the reflection coefficient ($s_{11}$) and the characteristic impedance ($Z_0$) of impedance analyzer 38 are known, the DUT impedance ($Z_x$) can be calculated.

The reflection coefficient ($s_{11}$) for DUT 33 can be described in terms of the DUT impedance ($Z_x$) and the characteristic impedance ($Z_0$) of impedance analyzer 38. This is shown, for example, by Equation 1 below:

Equation 1

$$s_{11} = \frac{Z_x - Z_0}{Z_x + Z_0}$$

For example, the characteristic impedance ($Z_0$) of impedance analyzer 38 is 50 ohms ($\Omega$), and can be substituted into Equation 1 to obtain Equation 2 below:

Equation 2

$$s_{11} = \frac{Z_x - 50\Omega}{Z_x + 50\Omega}$$

When the DUT impedance ($Z_x$) is close to 50 ohms, the value of the reflection co-efficient for DUT 33 is very sensitive to changes in DUT impedance ($Z_x$). This results in a low signal-to-noise ratio (SNR) when using the value of the reflection co-efficient to determine the DUT impedance. Thus it is possible to determine a value for DUT impedance to a high resolution.

When the DUT impedance ($Z_x$) is much less than 50 ohms, the value of the reflection co-efficient for DUT 33 is not very sensitive to changes in DUT impedance ($Z_x$). For example, if A/D converter 18 and A/D converter 19 each produce 14 bit digital values it is very difficult to detect small changes in impedance when DUT impedance ($Z_x$) is less than 5 ohms.

In some A/D converters, a dither signal is used at the input of the A/D converter to increase the resolution of the A/D converter. This dither signal can be a pseudorandom signal modulated out of the frequency band of the intermediate frequency and within the sampling bandwidth of the A/D converter. The dither signal is added to the input of the A/D converter. This signal is later rejected via a digital filter in the host digital signal processor, and the true value of the input signal is the digital average of the input and dither signal in a filtering mode. Theoretically one can achieve an infinite resolution using this technique, using an infinite averaging time and losing one or more least significant bits of resolution in the A/D converter. But this procedure is not suitable for real time and high speed impedance measurements.

Likewise, when the DUT impedance ($Z_x$) is much greater than 50 ohms, the value of the reflection co-efficient for DUT 33 is not very sensitive to changes in DUT impedance. For example, if A/D converter 18 and A/D converter 19 each produce 14 bit digital values it is very difficult to detect changes in impedance when DUT impedance ($Z_x$) is greater than 400 ohms.

In order to calculate the reflection coefficient ($s_{11}$) for DUT 33 when the DUT impedance ($Z_x$) is not close to 50 ohms, attenuator 27 and phase shifter 20 create the adjusted signal which the variable gain differential amplifier 21 subtracts from the reflected signal. Attenuator 27, phase shifter 20 and variable gain differential amplifier 21 act as a modification circuit to provide a "zoom" modification component and a "boom" modification component to the modified signal measured by A/D converter 19.

The zoom function is accomplished synthetically using the modified phase and magnitude of the reference signal and subtracting the adjusted signal from the reflected signal by differential amplifier 21. The boom component of the modified signal results in increasing the intermediate frequency (IF) gain of the modified signal to amplify the resolution of the modified signal as detected by A/D converter 19.

In the zoom and boom mode, switch 28 connects the output of phase shifter 28 to an input of variable gain differential amplifier 21. Switch 29 connects the output of mixer 15 to the other input of differential amplifier 21. Switch 30 and switch 31 connect the output of variable gain differential amplifier 21 to A/D converter 19. Phase shift through phase shifter 20 and amplification through variable gain differential amplifier 21 are adjusted to accomplish the desired zoom and boom effects.

For example, in VNA mode, impedance amplifier 38 does not have the measurement resolution to measure the reflection coefficient change when the DUT impedance is changed from 100 kilohms to 101 kilohms. In the zoom and boom mode it is possible to modify the zoom reference impedance and intermediate frequency gain (boom) to allow for sufficient resolution. For example, if the zoom reference impedance is changed to 100 kilohms and intermediate frequency (IF) gain is changed to 30 dB, impedance amplifier 38 has the measurement resolution to measure the reflection coefficient change when the DUT impedance is changed from 100 kilohms to 101 kilohms.

Likewise, in VNA mode, impedance amplifier 38 does not have the measurement resolution to measure the reflection coefficient of an open ended coaxial cable modeled as a parallel R-C circuit and having an equivalent parallel resistance of 100 kilohms and a capacitance of 0.5 Femto Farads (ff). In the zoom and boom mode it is possible to modify the zoom reference impedance and intermediate frequency gain (boom) to allow resolution. For example, if the zoom reference impedance is changed to 100 kilohms and IF gain set at 20 dB, impedance analyzer 38 has the measurement resolution to measure the reflection coefficient change when the resistance remains at 100 kilohms and the capacitance is changed from 0.5 ff to 0.55 ff.

The different signal paths that can be created by switches 28, 29, 30 and 31 allow for calibration of attenuator 27 and phase shifter 20. The calibration is limited by the resolution of A/D converter 18 and A/D converter 19.

For example, a two-tier calibration of impedance analyzer 38 can be performed. In the first tier calibration, a VNA one-port calibration is performed on impedance analyzer 38 as if impedance analyzer 38 were a VNA. For example, this is done by taking measurements using open, short and load connections to impedance analyzer 38. Alternatively, electronic calibration techniques can be used, or any other technique known in the art, such as use of short, offset short and load. Measurements for the calibration are made, for example using A/D converter 18 and A/D converter 19.

Local oscillator 57 and local oscillator 58 are derived from the same source. Local oscillator 56 and local oscillator 59 are derived from the same source. Also, the path length connecting local oscillator 56 to mixer 46 is equal to the path length connecting local oscillator 59 to mixer 49. Also, the path length connecting local oscillator 57 to mixer 47 is equal to the path length connecting local oscillator 58 to mixer 48. This insures correlated phase noise and will allow common mode cancellation of coherent noise by a digital signal processor (DSP) 66. Mixers 46 and mixer 47 are used to lower the final IF frequency enough that the phase shifting function can be achieved via delaying the data stream for A/D converter 61. Alternatively, mixers 46 and mixer 47 can be eliminated and the phase shifting function can be achieved by digital signal processor 66.

In the second tier calibration, measurements are also taken at A/D converter 18 and A/D converter 19. For example, the output of differential amplifier 21 is connected to A/D converter 19. Attenuator 27 and phase shifter 20 are set to values so that the output of differential amplifier 20 is forced to a null value, or very close to a null value. The value measured by A/D converter 19 as well as the settings for attenuator 27 and phase shifter 20 are stored. Differential amplifier 21 is calibrated for direct current (DC) offset and balance.

Figure 2:
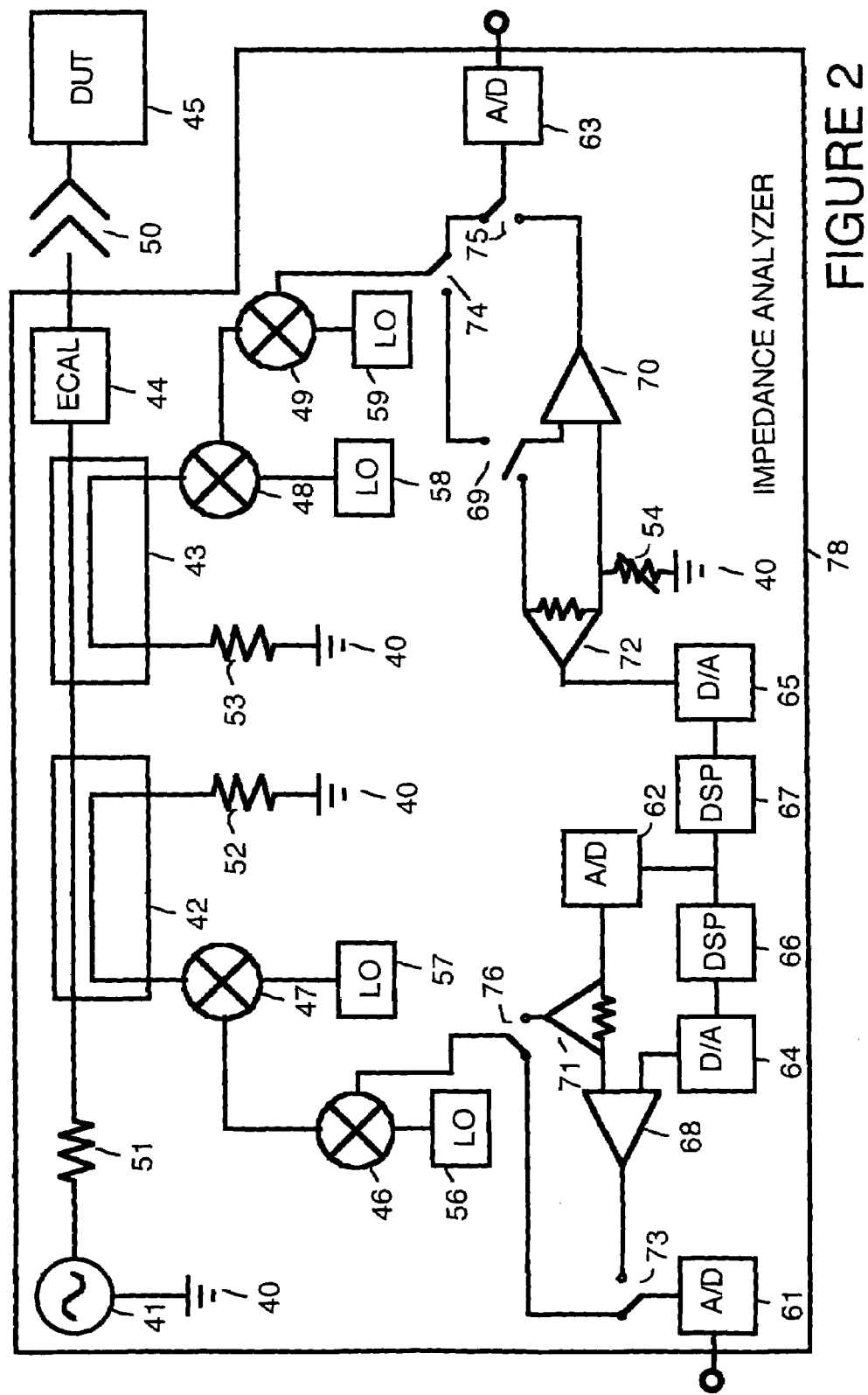
FIG. 2 is a simplified block diagram of an impedance analyzer in accordance with another embodiment of the present invention.

FIG. 2 is a simplified block diagram showing an impedance analyzer 78. A signal source 41 connected to a system ground 40 generates a reference signal through a resistance 51. A signal coupler 42 couples the reference signal to a signal line between a mixer 47 and a resistor 52 connected to system ground 40. Mixer 47 mixes the coupled reference signal with a local oscillator signal from a local oscillator 57 to convert the reference signal to an intermediate frequency signal. A mixer 46 mixes the intermediate frequency signal with a local oscillator signal from a local oscillator 56 to convert the intermediate frequency signal to a lower frequency intermediate frequency signal that can be captured using an analog-to-digital (A/D) converter 61. A switch 73 and a switch 76 can be set so as to connect the lower frequency intermediate frequency signal to A/D converter 61.

The reference signal is sent through an electronic calibration circuit (ECAL) 44 and a transmission line 50 to a DUT 45. ECAL 44 is used to correct for system and instrument drift. A reflected signal returns from DUT 45. A signal coupler 43 couples the reflected signal to a signal line between a mixer 48 and a resistor 53 connected to system ground 40. Mixer 48 mixes the coupled reference signal with a local oscillator signal from a local oscillator 58 to convert the reflected signal to an intermediate frequency signal. A mixer 49 mixes the intermediate frequency signal with a local oscillator signal from a local oscillator 59 to convert the intermediate frequency signal to a lower frequency intermediate frequency signal that can be captured using an A/D converter 63. A switch 74 and a switch 75 can be set so as to connect the lower frequency intermediate frequency signal to A/D converter 63.

When switch 76 and switch 73 connect the lower frequency intermediate signal from mixer 46 directly to A/D converter 61 and switch 74 and switch 75 connect the lower frequency intermediate signal from mixer 49 directly to A/D converter 61, the system is in a VNA mode and acts as a conventional one port VNA or reflectometer. The reflection coefficient $(s_{11})$ for DUT 45 can be calculated by dividing the value detected by A/D converter 63 by the value detected by A/D converter 61. Once the reflection coefficient $(s_{11})$ and the characteristic impedance $(Z_0)$ of impedance analyzer 78 are known, the DUT impedance $(Z_x)$ can be calculated, as discussed above.

The reflection coefficient $(s_{11})$ for DUT 45 can be described in terms of the DUT impedance $(Z_x)$ and the characteristic impedance $(Z_0)$ of impedance analyzer 78, as illustrated by Equation 1 above. For example, the characteristic impedance $(Z_0)$ of impedance analyzer 78 is 50 ohms $(\Omega)$, and can be substituted into Equation 1 to obtain Equation 2 above.

When the DUT impedance $(Z_x)$ is close to 50 ohms, the value of the reflection co-efficient for DUT 45 is very sensitive to changes in DUT impedance $(Z_x)$. This results in a low signal-to-noise ratio (SNR) when using the value of the reflection co-efficient to determine the DUT impedance. Thus it is possible to determine a value for DUT impedance to a high resolution.

When the DUT impedance $(Z_x)$ is much less than 50 ohms, the value of the reflection co-efficient for DUT 45 is not very sensitive to changes in DUT impedance $(Z_x)$. Likewise, when the DUT impedance $(Z_x)$ is much greater than 50 ohms, the value of the reflection co-efficient for DUT 45 is not very sensitive to changes in DUT impedance.

In order to calculate the reflection coefficient $(s_{11})$ for DUT 45 when the DUT impedance $(Z_x)$ is not close to 50 ohms, additional modification circuitry is added (not shown) to create an adjusted reference signal which a differential amplifier 70 subtracts from the reflected signal to produce a modified signal. There is a "zoom" component and a "boom" component to the modified signal.

The zoom component of the modified signal results in the real part of the equivalent (zoom) impedance of the impedance amplifier being matched, or at least in close range, to the DUT impedance. For example, a complex reflection coefficient (S11) has a Magnitude (s11) and Phase (s11). The reference signal can be modified and subtracted from the reflected signal, using a differential amplifier, in such a way that the output of the differential amplifier is zero when the reflected signal with respect to reference signal has the same magnitude and the phase at the DUT.

The boom component of the modified signal results in increasing the intermediate frequency (IF) gain of the signal to amplify the resolution of the modified signal as detected by A/D converter 63.

In the embodiment shown in FIG. 2, digital signal processing can be used to adjust both the reference signal as captured by A/D converter 61, and the reflection signal as captured by A/D converter 63.

When in the boom and zoom mode, switch 76 directs the lower frequency intermediate frequency signal from mixer 46 to a power divider 71. An A/D converter 62 converts the divided signal to a digital signal which is captured by the digital signal processor (DSP) 66 and a DSP 67. Digital signal processor 66 processes the reflected signal and forwards the processed signal to a digital-to-analog (D/A) converter 64. A differential amplifier 68 compares the output from D/A converter 64 o the signal from power divider 71 to produce a signal that is forwarded to A/D converter 61.

Since the output signal level from D/A converter 64 is known to a high accuracy and the output signal level from D/A converter 64 acts as the reference to the differential amplifier 68, that is used to subtract the analog reference signal from power divider 71 via differential amplifier 68, the gain of the differential amplifier 68 is set very high (i.e. 30 dB) in order to overcome the A/D resolution. Initially, at the time of calibration, output of differential amplifier 68 is set at or close to zero. If the output power of source 41 drifts and its drift value falls in between the resolution of A/D converter 61, the drift of the source 41 can, with a very high level of accuracy be determined. For example, the drift can be accurately determined dithering A/D converter 68 and using a long averaging time. This allows detection of the average of the drift versus the instantaneous drift.

DSP 67 processes the reference signal and forwards the processed signal to a digital-to-analog (D/A) converter 65. DSP 67 accomplishes the phase shift performed by phase shifter 20 shown in FIG. 1. The phase error caused by DSP 67 is minimized by using a low frequency intermediate frequency and a high speed A/D converter 62. For example, mixer 46 produces a signal with a frequency in the range of 10 kilohertz. In order to restore attenuated loss, a differential amplifier 70 is used to attenuate the processed signal. For example, the processed signal is forward to a power divider 72. Both outputs of power divider are connected to inputs of differential amplifier 70. A small high resolution attenuator 54 is used to control the amount of attenuation.

In order to calibrate high resolution attenuator 54, a first output of power divider 72 is connected to a first input of differential amplifier 70 through a switch 69. A second output of power divider 72 is further attenuated by high resolution attenuator 54 and connected to a second input of differential amplifier 70. Differential amplifier 70 is set to highest gain and the common mode is calibrated and nulled, as will be understood by a person familiar with the art. The setting for high resolution attenuator 54 is then calibrated via differential amplifier 70 and A/D converter 63.

Switch 74 and switch 69 connect the output of mixer 49 to the other input of differential amplifier 70. Switch 75 connects the output of differential amplifier 70 to A/D converter 63. DSP 66 and DSP 67 adjust the signals to accomplish the desired zoom and boom effects.

The different signal paths that can be created by switches 69, 73, 74, 75 and 76 allow for full calibration of impedance analyzer 78. For example, a two tier calibration of impedance analyzer 78 can be performed. In the first tier calibration, a VNA one port calibration is performed on impedance analyzer 78 as if impedance analyzer 78 were a VNA. For example, this is done by taken measurements using open, short and load connections to impedance analyzer 78. Alternatively, electronic calibration techniques can be used, or any other technique known in the art, such as use of short, offset short and load. Measurements for the calibration are made, for example using A/D converter 61 and A/D converter 63. In the second tier calibration, measurements are also taken at A/D converter 61 and A/D converter 63 in different combinations of switching.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. An impedance analyzer comprising:
   a reference signal;
   a first converter;
   a first coupler that couples the reference signal to the first converter, the first converter producing a reference intermediate frequency signal;
   a second converter;
   a second coupler that couples a reflected signal to the second converter, the second converter producing a reflected intermediate frequency signal;
   a modification circuit;
   a reference signal detector; and,
   a reflected signal detector;
   wherein a reflection coefficient for a device under test is determined by using a reflected value detected by the reflected signal detector and a reference value detected by the reference signal detector;
   wherein in a first operating mode of the impedance analyzer, the reflected intermediate frequency signal is forwarded directly to the reflected signal detector; and,
   wherein in a second operating mode of the impedance analyzer, the modification circuit operates on the reference intermediate frequency signal to produce an adjustment signal that is combined with the reflected intermediate frequency signal before a resulting signal is forwarded to the reflected signal detector.

2. An impedance analyzer as in claim 1 wherein the first converter is a first mixer and the second converter is a second mixer.

3. An impedance analyzer as in claim 1 wherein the first converter comprises two mixers in series.

4. An impedance analyzer as in claim 1, wherein a differential amplifier is used to alter the reflected intermediate frequency signal before the reflected intermediate frequency signal is forwarded to the reflected signal detector.

5. An impedance analyzer as in claim 1 wherein the impedance analyzer include switches which provide for additional signal paths used for calibration of the impedance analyzer.

6. An impedance analyzer as in claim 1 wherein the impedance analyzer includes electronic calibration circuitry.

7. An impedance analyzer as in claim 1 wherein the modification circuit comprises a signal attenuator and a signal phase shifter.

8. An impedance analyzer as in claim 7 wherein the signal attenuator and the signal phase shifter are implemented using analog circuitry.

9. An impedance analyzer as in claim 7 wherein the signal phase shifter is implemented using a digital signal processor.

10. An impedance analyzer as in claim 7 wherein the reflection coefficient is determined by dividing the reflected value by the reference value.

11. A method for analyzing impedance in a device under test comprising:
    providing a first mode whereby an impedance analyzer analyzes impedance of the device under test, including:
       converting a reference signal to produce an intermediate reference signal,
       detecting the intermediate reference signal to produce a reference value,
       converting a reflected signal from the device under test to produce an intermediate reflected signal,
       detecting the intermediate reflected signal to produce a first reflected value,
       producing a first reflection coefficient for the device under test using the first reflected value and the reference value,
       using the first reflection coefficient to determine impedance of the device under test, and
       displaying a first value for the impedance of the device under test; and,
    providing a second mode whereby the impedance analyzer analyzes impedance of the device under test, including:
       converting the reference signal to produce the intermediate reference signal,
       detecting the intermediate reference signal to produce the reference value,
       converting the reflected signal from the device under test to produce an intermediate reflected signal,
       adjusting the intermediate reference signal to produce an adjustment value,
       modifying the intermediate reflected signal using the adjustment value to produce a modified reflected signal, and,
       detecting the modified reflected signal to produce a second reflected value,
       producing a second reflection coefficient for the device under test using the second reflected value and the reference value,
       using the second reflection coefficient to determine impedance of the device under test, and
       displaying a second value for the impedance of the device under test.

12. A method as in claim 11 wherein adjusting the intermediate reference signal to produce an adjustment value includes at least one of the following:
    phase shifting the intermediate reference signal;
    attenuating the reference signal.

13. A method as in claim 11 wherein the reference signal and the reflected signal are converted using mixers.

14. A method as in claim 11, wherein modifying the intermediate reflected signal using the adjustment value to produce a modified reflected signal is performed using a differential amplifier.

15. An impedance analyzer comprising:
- means for converting a reference signal to produce a reference intermediate frequency signal;
- means for converting a reflected signal from a DUT to produce a reflected intermediate frequency signal;
- means for detecting the reference intermediate signal to produce a reference value;
- means for performing phase shifting of the reference intermediate frequency signal to produce an adjusted signal,
- means for combining the adjusted signal and the reflected intermediate frequency signal to produce a modified signal;
- means for selecting the modified signal or the reflected intermediate frequency signal to be detected to produce a reflected value; and,
- means for determining a reflection coefficient for the DUT utilizing the reference value and the reflected value.

16. An impedance analyzer as in claim 15 wherein the means for performing phase shifting is implemented using analog circuitry.

17. An impedance analyzer as in claim 15 wherein the means for performing phase shifting is implemented using a digital signal processor.

18. An impedance analyzer as in claim 7 wherein the reflection coefficient is determined by dividing the reflected value by the reference value.

19. An impedance analyzer as in claim 15 wherein the means for converting the reference signal and the means for converting the reflected signal are implemented using mixers.

20. An impedance analyzer as in claim 15 wherein the impedance analyzer include switches which provide for additional signal paths used for calibration of the impedance analyzer.

* * * * *